(12) United States Patent
Inui et al.

(10) Patent No.: US 8,044,428 B2
(45) Date of Patent: Oct. 25, 2011

(54) PACKAGE AND SEMICONDUCTOR DEVICE FOR PREVENTING OCCURRENCE OF FALSE CONNECTION

(75) Inventors: Tsuyoshi Inui, Hirakata (JP); Hideo Kado, Hirakata (JP); Yoshinobu Kawamoto, Uda (JP)

(73) Assignee: Panasonic Electric Works Sunx Co., Ltd., Kasugai, Aichi (JP)

( * ) Notice: Subject to any disclaimer, the term of this patent is extended or adjusted under 35 U.S.C. 154(b) by 199 days.

(21) Appl. No.: 12/187,672

(22) Filed: Aug. 7, 2008

(65) Prior Publication Data

US 2009/0039380 A1    Feb. 12, 2009

(30) Foreign Application Priority Data

Aug. 10, 2007    (JP) ................................. 2007-210064
Jul. 16, 2008     (JP) ................................. 2008-185349

(51) Int. Cl.
    *H01L 33/00*    (2010.01)
(52) U.S. Cl. ................ 257/99; 257/79; 257/80; 257/81; 257/84; 257/704; 438/22
(58) Field of Classification Search ............... 257/E33, 257/431, 414, 212, 13, 79, 80, 81, 82, 84, 257/690, 686, 678, 704, 708, 685, 710, E31.084, 257/E31.099, E31.105, 88, 99; 438/22, 24, 438/125
See application file for complete search history.

(56) References Cited

U.S. PATENT DOCUMENTS

| | | | |
|---|---|---|---|
| 6,425,768 B1 * | 7/2002 | Taylor | 439/67 |
| 7,204,615 B2 | 4/2007 | Arik et al. | |
| 7,332,802 B2 * | 2/2008 | Konno | 257/690 |
| 7,445,081 B2 * | 11/2008 | Tominaga | 180/444 |
| 7,482,636 B2 | 1/2009 | Murayama et al. | |
| 7,495,322 B2 | 2/2009 | Hashimoto et al. | |
| 7,543,961 B2 | 6/2009 | Arik et al. | |
| 7,557,383 B2 | 7/2009 | Obara et al. | |
| 2007/0039164 A1 * | 2/2007 | Kwon et al. | 29/592.1 |
| 2008/0111949 A1 * | 5/2008 | Shibata et al. | 349/64 |
| 2009/0008771 A1 * | 1/2009 | Torii et al. | 257/713 |
| 2009/0095960 A1 | 4/2009 | Murayama | |

FOREIGN PATENT DOCUMENTS

| | | |
|---|---|---|
| EP | 1 780 804 A1 | 5/2007 |
| JP | 50-38482 | 4/1975 |
| JP | 51-24871 | 2/1976 |

(Continued)

*Primary Examiner* — Ha Tran T Nguyen
*Assistant Examiner* — Thanh Y Tran
(74) *Attorney, Agent, or Firm* — Drinker Biddle & Reath LLP

(57) ABSTRACT

A package has a base substrate that is a metal plate electrically connected to one electrode of a UV-ray light emitting diode and a cover substrate that is a metal plate electrically connected to the other electrode and that is stacked on the base substrate. A plurality of packages are mounted on a header such that center lines of the base substrates extending in their widthwise directions are aligned to each other. The cover substrates are arranged asymmetrical with respect to the longitudinal center line of the base substrates so as to traverse the center line. When mounted on the header, the packages are arranged such that positions of the cover substrates are staggered with respect to the center line. Moreover, the base substrate of one of the adjacent packages and the cover substrate of the other adjacent package are connected together by a connection plate fastened to the base substrates and the cover substrate by connection screws.

15 Claims, 11 Drawing Sheets

FOREIGN PATENT DOCUMENTS

| | | |
|---|---|---|
| JP | 51-101482 | 9/1976 |
| JP | 58-114056 | 8/1983 |
| JP | 2-134260 | 5/1990 |
| JP | 3-145774 | 6/1991 |
| JP | 2005-158957 | 6/2005 |
| JP | 2006-019676 | 1/2006 |
| JP | 2006-522479 | 9/2006 |
| JP | 2007-19265 | 1/2007 |
| JP | 2007-59207 | 3/2007 |
| JP | 2007-109404 | 4/2007 |
| JP | 2007-109879 | 4/2007 |
| JP | 2009-64986 | 3/2009 |
| WO | 2005/029597 A1 | 3/2005 |
| WO | 2005/038935 A1 | 4/2005 |

* cited by examiner

PACKAGE AND SEMICONDUCTOR DEVICE FOR PREVENTING OCCURRENCE OF FALSE CONNECTION

BACKGROUND OF THE INVENTION

1. Field of the Invention

The present invention relates to a package made of metal that houses a semiconductor element and a semiconductor device constituted by electrical connecting a plurality of packages.

2. Related Art

In general, in order to connect a multiple of semiconductor devices of the same type in series or parallel, lead wires for interconnecting terminals of the semiconductor devices or a conductor pattern for connection formed on a printed wiring board where the semiconductor devices are to be mounted are used.

A technique of providing a package housing a semiconductor element with a joint section having a plurality of linearly-arranged terminals and linking the terminals together by use of a harness, and the like, has also been proposed (see, for instance, JP-A-2007-109879).

Incidentally, when several semiconductor devices are connected together by use of lead wires, there arises a problem of connection work involving the expense of laborious efforts and an increase in the likelihood of false connection. Further, use of a printed wiring board leads to a reduction in the likelihood of false connection but requires a step of processing a conductor pattern of the printed wiring board, which in turn raises a problem of an increase in the number of steps.

The risk of false connection will be small, so long as the technique described in JP-A-2007-109879 is adopted. However, a joint section having terminals used for connecting harnesses to respective packages must be formed, which raises a problem of a significant increase in the number of steps employed during manufacturing.

SUMMARY OF THE INVENTION

The present invention has been conceived for these reasons and aims at providing a package and a semiconductor device that suppress an increase in the number of steps which would arise during manufacturing and that can prevent occurrence of false connection when a plurality of packages are electrically connected.

A first aspect of the invention is directed toward a package mounted in plural on a mount surface of a support base, housing a semiconductor element, comprising: a base substrate provided with a metal plate mounted on the support base and electrically connected to one electrode of the semiconductor element; and a cover substrate provided with a metal plate stacked on one surface of the base substrate in a thickness direction and electrically connected to another electrode of the semiconductor element.

A second aspect of the invention is characterized in that the semiconductor element is a light emitting diode.

A third aspect of the invention is characterized in that the base substrate has a mount hole through which a mount screw screwed to the support base passes, and the cover substrate has a cover side connection hole into which a first connection screw passing through a first connecting conductor is screwed.

A fourth aspect of the invention is characterized in that the base substrate has a base side connection hole into which a second connection screw passing through one end of a first connecting conductor electrically connected to a cover substrate stacked on a base substrate in an adjacent package is screwed; and the cover substrate is disposed in an asymmetrical shape with respect to a center line of the base substrate extending in an arranging direction in which base substrates are to be arranged on the support base and disposed so as to traverse the center line, and the base side connection hole is formed on one side with respect to the center line.

A fifth aspect of the invention is characterized in that the cover substrate is configured so that distances from the center line to respective end edges of the cover substrate that are located opposite sides of the center line are different with each other, the base side connection hole is formed in an area where the cover substrate is not superposed on the base substrate.

A sixth aspect of the invention is characterized in that a bore is notched in the cover substrate at a position superposing on the base side connection hole in a size such that the cover substrate does not contact with the second connection screw.

A seventh aspect of the invention is characterized in that a cover side connection hole into which a first connection screw passing through a first connecting conductor is screwed is formed in the cover substrate at an opposite side of the base side connection hole with respect to the center line.

An eighth aspect of the invention is characterized by a semiconductor device comprising a plurality of foregoing packages which are mounted on the support base, wherein the support base is formed with a conductive metal material, and the base substrates of the plural packages are electrically connected with the support base.

A ninth aspect of the invention is characterized by a semiconductor device comprising a plurality of foregoing packages which are mounted on the support base, wherein the support base is formed with an insulating material.

A tenth aspect of the invention is characterized by a semiconductor device comprising a plurality of foregoing packages which are mounted on the support base, wherein the packages are mounted on the support base such that center lines of the base substrates extending along an arranging direction of the base substrates on the support base are aligned to each other and that the cover side connection holes are aligned to each other, and the first connecting conductor is disposed so as to traverse plural packages and is fixed to the cover substrates by first connection screws.

An eleventh aspect of the invention is characterized in that a second connecting conductor superposing on the base substrates is disposed so as to traverse plural packages, and the second connecting conductor is fixed to the support base along with the packages by passing the mount screws through the second connecting conductor.

A twelfth aspect of the invention is characterized by a semiconductor device comprising a plurality of foregoing packages which are mounted on the support base such that the center lines of the base substrates are aligned to each other, wherein adjacent packages are arranged such that positions of the cover substrates are staggered with respect to the center lines.

A thirteenth aspect of the invention is characterized in that the first connecting conductor is a connection plate mounted on the cover substrate and includes a base-side piece superposed on a front surface of the base substrate, a cover-side piece superposed on a front surface of the cover substrate, and a joint piece for joining the base-side piece to the cover-side piece.

A fourteenth aspect of the invention is characterized in that the first connecting conductor is a connection piece formed continuously, integrally on the cover substrate, and an extremity of the connection piece is superposed on the front surface of the base substrate.

According to the first aspect of the invention, since the base substrate and the cover substrate are stacked each other such that the base substrate and the cover substrate are electrically connected with electrodes of the semiconductor device, the structure becomes simple and an increase in the number of steps conducted during manufacturing can be small, as compared with a structure in which terminals are separately provided. Further, since the packages are provided with metal plates, enhanced heat radiation performance is exhibited, and a power element can be applied to the package.

Further, the base substrate is connected with one electrode of the semiconductor element and the cover substrate is connected with another electrode of the semiconductor element. Hence, in a case that the packages arranged on the support base are connected in series, the base substrate of one package and the cover substrate of the other package are connected with each other in an adjacent pair of the packages. Further, in a case that the packages arranged on the support base are connected in parallel, the base substrates are connected with each other and the cover substrate are connected with each other. In both cases, it is possible to find false connection easily by visual observation.

Further, since the cover substrate is stacked on the base substrate which is mounted on the support base, it is possible to obtain an elongated configuration by arranging plural packages on the mount surface of the support base. Moreover, by arranging the packages without forming interval between adjacent base substrates, it is possible to mount semiconductor elements with high density. Accordingly, when the semiconductor elements are light emitting elements such as light emitting diodes, it is possible to obtain easily an elongated light source. In addition, it is possible to suppress unevenness in light intensity along the longitudinal direction by making intervals narrow between the adjacent light emitting diodes.

According to the second aspect of the invention, a metal package is used for a package of a light emitting diode, it is possible to enhance the heat radiation performance and to suppress the temperature raise of the light emitting diode consequently, it is possible to obtain a high output light source using light emitting diodes. In other words, light emission efficiency of the light emitting diode is deteriorated when the temperature of the light emitting diode is raised. In the invention, by providing a package having a high heat radiation performance, it is possible to suppress such temperature raise even when high current is input. Therefore, it is possible to illuminate the device with high output maintaining high light emission efficiency.

According to the third aspect of the invention, as the base substrate can be fixed to the support base with the mount screws, it is possible to improve the fixing strength of the base substrate to the support base. Further, the base substrate can be easily detached from and attached again to the support base for maintenance. In addition, since the first connecting conductor can be mounted on the cover substrate with the first connection screw, it is possible to electrically connect the cover substrate and the first connecting conductor reliably by forming a close contact between the cover substrate and the first connecting conductor.

According to the fourth aspect of the invention, the base substrate which is electrically connected with an electrode of the semiconductor and the cover substrate are stacked, and the cover substrate is disposed in an asymmetrical shape with respect to the center line of the base substrate extending in the arranging direction in which base substrates are to be arranged on the support base. Consequently, it is possible to easily determine an existence of a false arrangement by visual observation of the positions of the cover substrates, when the packages are arranged on the support base. Further, one end of the first connecting conductor electrically connected with one cover substrate is joined to the base substrate with the connection screw in the adjacent packages. Consequently, it is possible to prevent a false connection between the packages unless the false arrangement of the packages on the support base is caused. Furthermore, the adjacent packages are coupled mechanically as well as electrically. In addition, since the base substrate and the cover substrate, constituting a package, are connected with two of electrodes of the semiconductor element respectively, the structure can be simplified and the increase of the number of process during manufacturing can be small, as compared with a structure in which separate terminals are provided. Further, since the package is provided with metal plates, enhanced heat radiation performance is exhibited and a power element can be applied to the package.

According to the fifth aspect of the invention, since the cover substrate is disposed in the asymmetric shape, most of the area on one side of the base substrate with respect of the center line is superposed with the cover substrate, whereas most of the area on other side of the base substrate is not superposed with the cover substrate and is exposed, it is possible to observe easily a mounting direction of the package base on the appearance. In other words, it is possible to easily find a false connection between the package and other parts when the base substrate and the cover substrate are connected with the other parts. Further, the base side connection hole is formed in the base substrate at the position where the cover substrate is not superposed. By forming the base side connection hole at the position where most of the area is exposed in the base substrate, the distance between the second connection screw screwed into the base side connection hole and the cover substrate can be made long so that electric insulation can be easily provided.

According to the sixth aspect of the invention, the bore is notched in the cover substrate at a position superposing on the base side connection hole in a size such that the cover substrate does not contact with the second connection screw. Therefore, the second connection screw does not contact with the cover substrate and it is possible to prevent short circuit between the base substrate and the cover substrate without using an insulating material for the second connection screw.

According to the seventh aspect of the invention, the base side connection hole is formed in the base substrate, and the covers side connection hole is formed in the cover substrate, and the base side connection hole and the cover side connection hole are formed on the opposite sides with respect to center line of the base substrate. Therefore, it is possible to mount the first connecting conductors easily so as to electrically connect the base substrate and the cover substrate in staggered manner in the adjacent packages in a state that the packages are mounted on the support base. In other words, by connecting one end of the first connecting conductor with the base substrate through the second connection screw and connecting the other end of the first connecting plate with the cover plate with the first connection screw, the adjacent packages can be connected in series. Further, by configuring the first connection plate so that the base substrates are electrically connected with each other and the cover substrates are electrically connected with each other in the adjacent packages, the adjacent packages can be connected in parallel.

According to eighth aspect of the invention, since the base substrate is electrically connected with the support base formed with a conductive metal material, the electric connection between the base substrates can be performed by the support base. In other words, it is not necessary to employ a separate conductive member to connect the adjacent base substrates with each other in order to connect the adjacent packages in parallel. Therefore, it is possible to reduce the number of parts. Further, although this structure can be employed only in a case that the packages are connected in parallel, it is possible to downsize the base substrates because the base side connection hole is unnecessary. Further, high heat radiation performance is also expected because the base substrates are brought into direct contact with the support base.

According to the ninth aspect of the invention, by employing the support base formed with the insulating material, it is possible to freely choose an electric connection between the adjacent packages.

According to the tenth aspect of the invention, since the packages are mounted on the support base such that center lines of the base substrates are aligned to each other, and the first connecting conductor traversing plural packages to connect the plural packages, the cover substrates are connected with each other in the adjacent packages only by providing the linear first connecting conductor. Therefore, the packages are connected in parallel easily.

According to the eleventh aspect of the invention, since the cover substrates are electrically connected with each other through the first connecting conductor in the plural packages, and the base substrates are also electrically connected with each other through the second connecting conductor, it is possible to connect the plural packages in parallel by two connecting conductors. Further, by coupling the second connecting conductor to the base substrates by the mount screws for mounting the base substrates on the support base, it is possible to perform integrally the fixture of the base substrates and the connection with the second connecting conductor. Therefore, as compared with the case that the second screw is separately provided for connecting the second connecting conductor with the base substrates, the number of parts is reduced and it is possible to downsize the base substrates because the base side connection hole is unnecessary.

According to the twelfth aspect of the invention, the adjacent packages are arranged such that the center lines of the base substrates are aligned with each other and that the positions of the cover substrates are staggered with respect to the center lines, it is possible to connect the packages in series only by connecting the base substrate and the cover substrate with the first connecting conductor that is linear when view from the front in the adjacent packages. In other words, since the semiconductors are connected with the short first connecting conductors, it is possible to suppress current loss in the first connecting conductor and also possible to prevent the false connection. In addition, it is possible to inspect the existence of the false connection only by visual observation of the positions of the cover substrates. Accordingly, it is possible to prevent the false arrangement at the assembly.

According to the thirteenth aspect of the invention, since the first connecting conductor is provided separately from the package, it is possible to simplify the shape of the package.

According to the fourteenth aspect of the invention, since the first connecting conductor is provided integrally with the package, any member for mounting is unnecessary except for the connection screw. Moreover, the adjacent pair of packages can be connected only by one connection screw, so that the connection work is performed easily.

DETAILED DESCRIPTION OF THE PREFERRED EMBODIMENTS

First Embodiment

Figure 1:
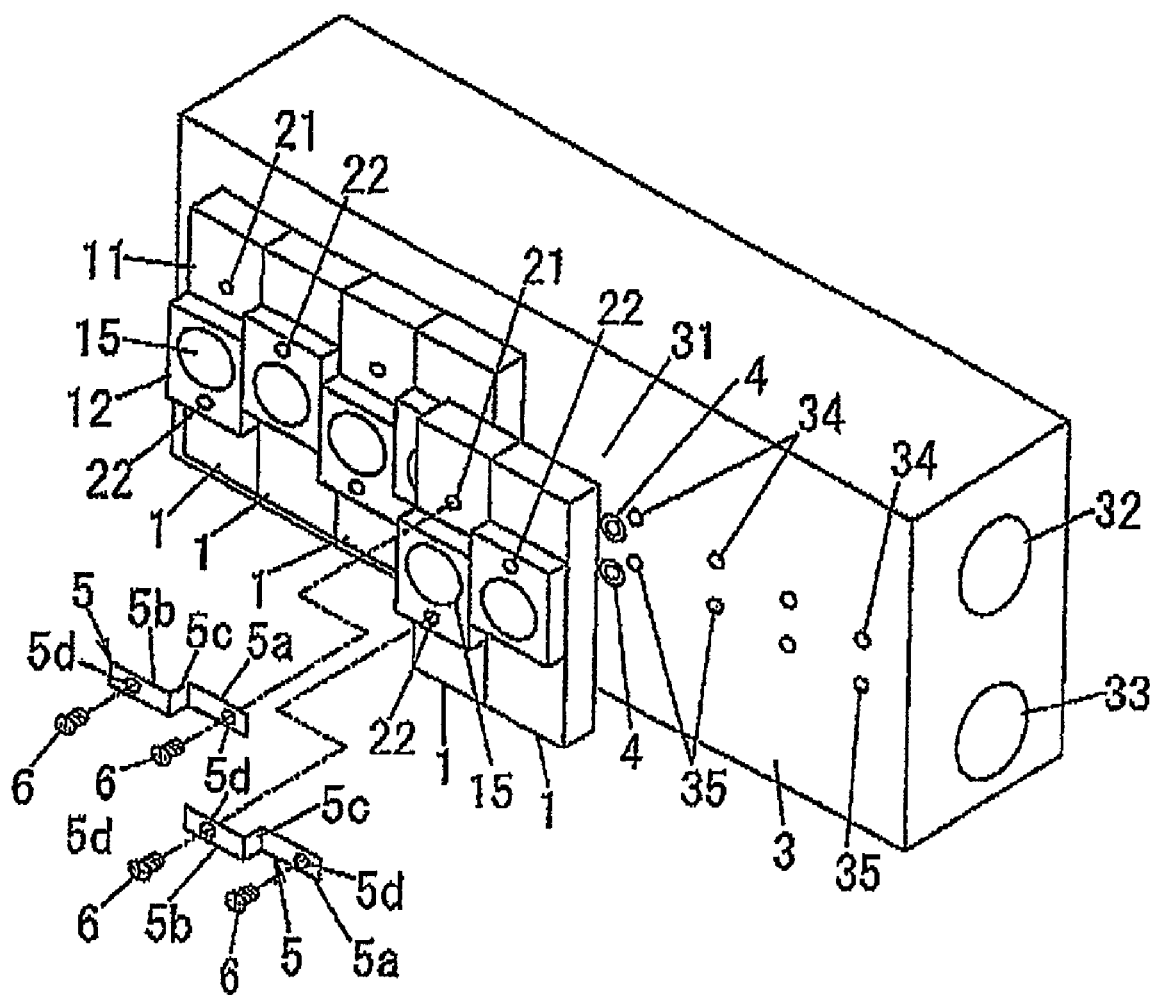
FIG. 1 is an exploded perspective view showing an example use of a package of a first embodiment.

A package to be described below is explained by taking, as an example, a case where the package houses a UV-ray light emitting diode as a semiconductor element. Incidentally, in the invention, not only with the UV-ray light emitting diode emitting light of ultra-violet ray wavelength range, it is also possible to constitute a package with a light emitting diode other than the UV-ray light emitting diode, such as one emitting light of visible wavelength range.

As shown in FIGS. 3 through 5C, a package 1 is constructed as a layered product generated by stacking a base substrate 11 made of a metal plate on which a UV-ray light emitting diode 2 is mounted, a cover substrate 12 made of a metal plate surrounding an area of the base substrate 11 where the UV-ray light emitting diode 2 corresponding to a bear chip is mounted, and an insulating material layer 13 that is interposed between the base substrate 11 and the cover substrate 12 and that insulates the base substrate 11 from the cover substrate 12. A copper element or a copper-based alloy is used for the base substrate 11 and the cover substrate 12, since a material having high heat conductivity and high electric conductivity is desirable to use for these substrates.

Figure 3:
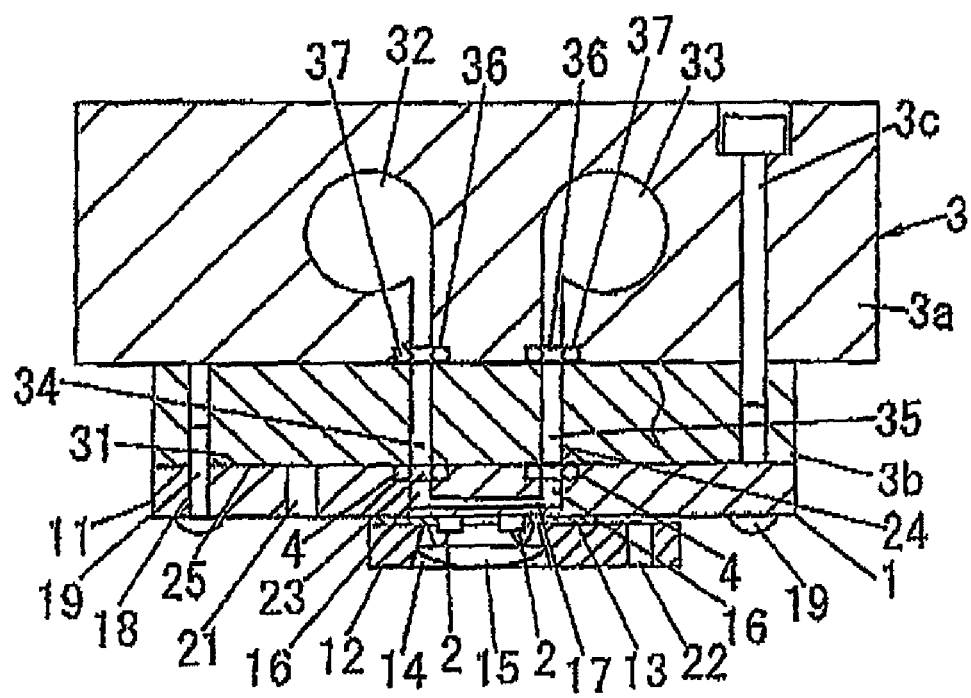
FIG. 3 is a cross-sectional view showing the example use of the package.
Figure 4A:
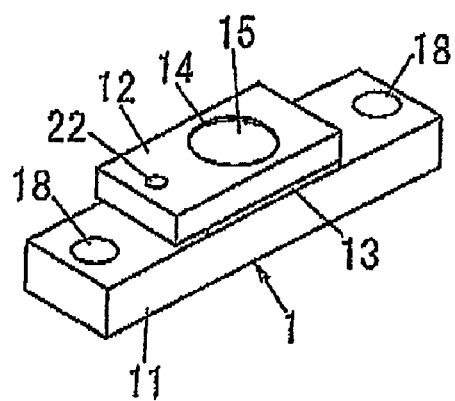
FIG. 4A is a perspective view of a front side of the package.
Figure 4B:
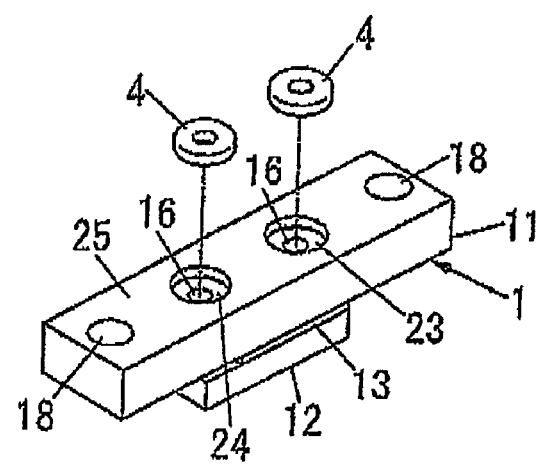
FIG. 4B is a perspective view of a rear side of the package.

As shown in FIG. 3, one electrode (the anode) of the UV-ray light emitting diode 2 is connected directly to the base substrate 11 by die bonding. The other electrode (the cathode) of the UV-ray light emitting diode 2 is connected to the cover substrate 12 by wire bonding. In other words, one electrode of the UV-ray light emitting diode 2 is electrically connected to the base substrate 11, and the other electrode of the same is electrically connected to the cover substrate 12.

An exposure hole 14 is opened in the cover substrate 12 so as to expose the UV-ray light emitting diode 2 mounted on the base substrate 11. An inner circumferential surface of the exposure hole 14 is tapered such that the inner diameter of the exposure hole 14 becomes greater with an increasing distance from the base substrate 11. A floodlight lens 15 having a convexly-curved (e.g., spherical) exterior surface is fitted in the exposure hole 14. Consequently, the UV-ray light emitting diode 2 is housed in an enclosed space surrounded by the base substrate 11, the cover substrate 12, and the floodlight lens 15 and shielded from the influence of the environment, such as a humidity. Luminous intensity distribution of light radiating from the UV-ray light emitting diode 2 can be controlled by adjusting the position and characteristic of the floodlight lens 15 or the angle of inclination or reflectance of the inner circumferential surface of the exposure hole 14.

The package 1 doubles as a heat sink. A pair of circulation orifices 16, each of which is circularly opened, are formed in the back of the base substrate 11 (a surface opposite to the surface of the base substrate 11 where the cover substrate 12 is stacked). Flow channels 17 for establishing mutual communication between the circulation orifices 16 are formed in the base substrate 11. Each of the flow channels 17 is formed such that the channel passes by a neighborhood of the base substrate 11 where the UV-ray light emitting diode 2 is mounted, whereby the degree of thermal coupling between a fluid for cooling purpose (herein after called a "cooling fluid") flowing through the flow channel 17 and the UV-ray light emitting diode 2 is enhanced. Water can be used for the cooling fluid, but a material other than water can also be used, so long as the material is in a liquid state at room temperatures and exhibits specific heat capacity close to one.

Figure 5A:
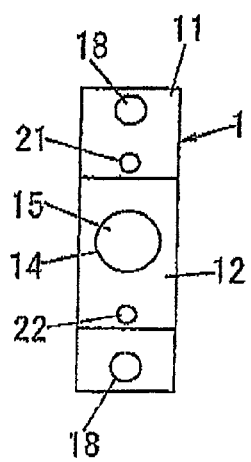
FIG. 5A is a front view of the package.
Figure 5B:
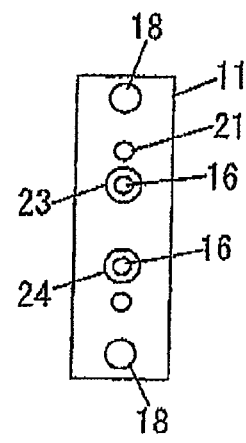
FIG. 5B is a rear view of the package.
Figure 5C:
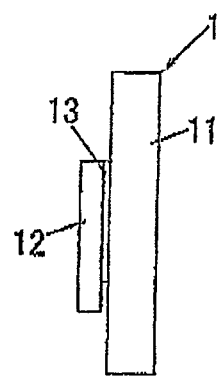
FIG. 5C is a side view of the package.

As shown in FIGS. 5A to 5C, in the present embodiment, both the base substrate 11 and the cover substrate 12 are formed into the shape of a rectangle and to the essentially-same width when viewed from the front of the floodlight lens 15. However, the base substrate 11 and the cover substrate 12 differ from each other in terms of a length, and the base substrate 11 is formed so as to become longer than the cover substrate 12. Moreover, the longitudinal center of the base substrate 11 is positionally different from the longitudinal center of the cover substrate 12; or to put it another way, one end of the cover substrate 12 in its longitudinal direction is extended to one side of the base substrate 11 along its longitudinal direction. The center of the floodlight lens 15 is aligned to the longitudinal center of the base substrate 11. Both of the circulation orifices 16 are formed while spaced apart from each other along the longitudinal direction of the base substrate 11.

A mount hole 18 is formed at each longitudinal end of the base substrate 11. Further, a base side connection hole 21 which is a screw hole is opened in the base substrate 11 and a cover side connection hole 22 which is a screw hole is opened in the cover substrate 12. The base side connection hole 21 and the cover side connection hole 22 are positioned between the longitudinal center of the base substrate 11 and the respective mount holes 18. An equidistance exists between a distance from the longitudinal center of the base substrate 11 to the base side connection hole 21 and a distance from the longitudinal center of the base substance 11 to the cover side connection hole 22. The base side connection hole 21 and the cover side connection hole 22 are provided for electrically connecting the UV-ray light emitting diode 2 to another member.

Consequently, when viewed from the front of the floodlight lens 15, the mount holes 18, the base side connection hole 21 and the cover side connection hole 22, and the floodlight lens 15 are positioned symmetrical with respect to the center line extending along the widthwise direction of the base substrate 11. In the meantime, the cover substrate 12 is placed asymmetrical with respect to the center line extending along the widthwise direction of the base substrate 11 and arranged so as to traverse the center line. That is, the distance from the center line to the one end of the cover substrate 12 in the longitudinal direction is different from the distance from the center line to the other end of the same. In other words, the cover substrate 12 is superposed on the base substrate 11 so that most of the area of the base substrate 11 is covered with the cover substrate 12 at the one end of the base substrate 11 in the longitudinal direction except for an area on which the mount hole 18 is exposed, whereas the mount hole 18 and the base side connection hole 21 are exposed at the other end of the base substrate 11 in the longitudinal direction. The cover substrate 12 is stacked on the base substrate 11, and the base side connection hole 21 is opened in the base substrate 11. The cover side connection hole 22 is opened in the cover substrate 12, and hole surfaces of the base side connection hole 21 and the cover side connection hole 22 are different in level from each other with respect to the thickness direction of the base substrate 11.

Incidentally, circularly-opened recesses 23 and 24 are formed around the respective circulation orifices 16. Put another way, the respective circulation orifices 16 are opened in inner bottom surfaces of the recesses 23 and 24, and the respective circulation orifices 16 are formed concentrically on the respective recesses 23 and 24.

Figure 2:
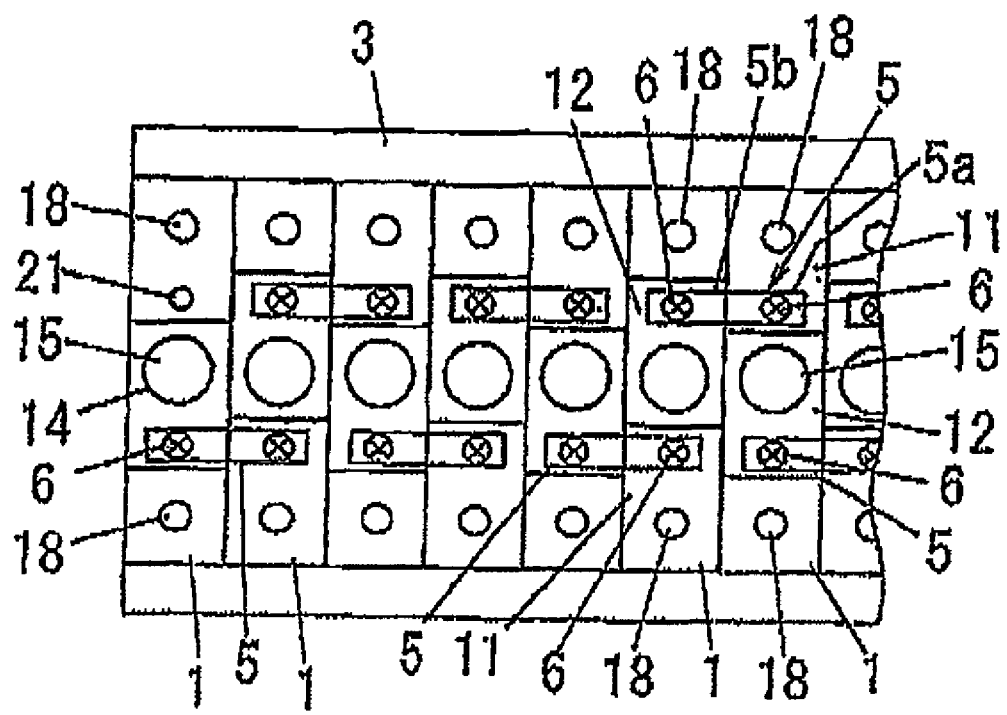
FIG. 2 is a front view showing the example use of the package.

On the occasion of use of the packages 1, the packages are coupled to a header 3 that allows circulation of the cooling fluid, as shown in FIGS. 1, 2, and 3. The header 3 functions as a support base on which the packages 1 are arranged side by side and is constructed by fixedly fastening a support base 3a made of a metal material and a spacer 3b made of an insulating material by a coupling screw 3c. The coupling screw 3c is screwed into the spacer 3b through the support base 3a. The header 3 is not limited to the shape mentioned above. No specific limitations are imposed on the cross-sectional profile of the header 3, so long as a mount surface 31 where the packages 1 are connected becomes a flat plane.

A supply path 32 and a discharge path 33 through which the cooling fluid is circulated are formed in the header 3. Supply ports 34 remaining in mutual communication with the supply path 32 and discharge ports 35 remaining in mutual communication with the discharge path 33 are opened at appropriate locations of the mount surface 31 of the header 3. The spacer 3b is omitted from FIG. 1 for the sake of simplification of indication.

The supply ports 34 and the discharge ports 35 are circularly opened, respectively. Open diameters of the ports are essentially equal to an open diameter of the circulation orifices 16. A distance between the supply port 34 and the discharge port 35 is made equal to the distance between the circulation orifices 16 formed in the package 1. A set consisting of the supply port 34 and the discharge port 35 is formed in plural (e.g., in a number of ten) in the header 3.

In order to join the package 1 to the header 3, the contact surface 25 of the base substrate 11 where the pair of circulation orifices 16 are opened is brought into contact with the mount surface 31 of the header 3, and mount screws 19 are screwed into the header 3 through the mount holes 18. At this time, an axis of the supply port 34 and an axis of the discharge port 35, which are opened in the mount surface 31 of the header 3 and belong to one set, are aligned to respective axes of the circulation orifices 16 of one package 1. Annular O-rings 4 exhibiting rubber elasticity are fitted into the respective recesses 23 and 24, and the package 1 is joined to the header 3 such that the O-rings 4 are compressed between the inner bottom surfaces of the recesses 23 and 24 and the mount surface 31 of the header 3, whereupon the supply port 34 and the discharge port 35 are joined to the corresponding circulation orifices 16 without involvement of a clearance gap.

The structure for joining the circulation orifices 16 in the packages 1 to the supply ports 34 and the discharge ports 35 of the header 3 is also used between the support base 3a and the spacer 3b of the header 3. Specifically, the supply path 32 and the discharge path 33 must be in mutual communication to each other between the support base 3a and the spacer 3b. Hence, as shown in FIG. 3, recesses 36 are formed in the support base 3a at the positions on the support base 3a and the spacer 3b where the supply path 32 and the discharge path 33 are joined to each other. Annular O-rings 37 arranged within the respective recesses 36 are sandwiched and compressed between the support base 3a and the spacer 3b.

Incidentally, since the base substrate 11 and the cover substrate 12 are electrically connected to the electrodes of the UV-ray light emitting diode 2, the base substrate 11 and the cover substrate 12 in the foregoing package 1 function as electrodes of a semiconductor device. When a semiconductor device of this type incorporating the light emitting diodes is used with high electric power, a plurality of semiconductor devices are often used while connected in series.

In the structure of the present embodiment, when the semiconductor devices are connected in series, the devices are arranged as follows. Specifically, as shown in FIGS. 1 and 2, the base substrates 11 are joined to the header 3 such that center lines of the base substrates 11 extending in their widthwise directions are aligned to each other, and packages 1 adjacent in the widthwise direction of the base substrate 11 are arranged such that the positions of the cover substrates 12 are staggered each other with respect to the center line. Further, of a pair of adjacent packages 1, the base substrate 11 of the one package and the cover substrate 12 of the other package are electrically connected to each other through a connection plate 5 provided with a first connecting conductor. In order to avoid mutual contact between the base substrates 11 and mutual contact between the cover substrates 12 in the adjacent packages 1, a clearance to secure electric insulation is formed or an insulation film made of an insulating material is interposed between the adjacent packages 1.

Each of the connection plates 5 continuously, integrally includes a base-side piece 5a that overlaps with the front surface of the base substrate 11, a cover-side piece 5b that overlaps with the front surface of the cover substrate 12; and a joint piece 5c that has a length corresponding to the length of a step between the front surface of the base substrate 11 and the front surface of the cover substrate 12 and that links the base-side piece 5a to the cover-side piece 5b. The connection plate 5 is made by bending a metal plate that is formed in a strip-shape from copper or a copper-based alloy. A through hole 5d is formed in each of the base-side piece 5a and the cover-side piece 5b of the connection plate 5.

In order to electrically connect the base substrate 11 to the cover substrate 12 through the connection plate 5 having the foregoing geometry, the base-side piece 5a of the connection plate 5 is superposed on the front surface of the base substrate 11, and the cover-side piece 5b of the same is superposed on the front surface of the cover substrate 12. The connection screw 6 is screwed into the base side connection hole 21 passing through the through hole 5d, and the connection screw 6 is screwed into the cover side connection hole 22 passing through the through hole 5d.

The adjacent packages 1 are connected together through the connection plate 5, whereby the base substrate 11 and the cover substrate 12 are connected to each other in the adjacent packages 1, and the UV-ray light emitting diodes 2 in the plurality of packages 1 can eventually be connected in series. Further, the packages 1 are arranged such that the positions of the cover substrates 12 become staggered (with respect to the vertical direction in FIGS. 1 and 2) with respect to the center line of the base substrates 11 aligned in the direction where the packages 1 are arranged, whereby the packages can be connected in series only through the connection plates 5, each of which has such a simple geometry as to connect the base side connection hole 21 and the cover side connection hole 22, which adjoin side by side, to each other. Moreover, an erroneous layout can be found at a glance because of the positional relationship among the cover substrates 12; hence, the risk of faulty connection can be lessened.

In the above embodiment, the surface of the base substrate 11 opposite the cover substrate 12 in the package 1 is taken as a contact surface 25. However, a surface of the base substrate 11 adjoining to the surface where the cover substrate 12 is provided can also be taken as the contact surface 25. For instance, one longitudinal end face of the base substrate 11 may also be taken as the contact surface 25, and the circulation orifices 16 may also be provided in the contact surface. Moreover, the circulation orifices 16 may also be provided at respective longitudinal end faces of the base substrate 11 instead of the two circulation orifices 16 being provided in one surface side by side, and the headers 3 may also be provided in number of two in agreement with the respective circulation orifices 16. Moreover, in the foregoing embodiment, the recesses 23 and 24 are provided in the package 1. However, the recesses 23 and 24 may also be provided in the header 3, or the recess 23 and 24 may also be provided in both the package 1 and the header 3.

The foregoing embodiment has provided, as an example, descriptions about the case where the UV-ray light emitting diodes 2 housed in the packages 1 are connected in series. However, when the UV-ray light emitting diodes 2 are arranged in parallel, the essential requirement is to align the positions of the cover substrates 12 in the respective packages 1 to the center line extending in the widthwise direction of the base substrates 11; and to connect cover substrates to a connecting conductor (a strip-shaped metal plate) traversing the overall arranged packages 1. Further, in this case, the base substrates 11 may be in contact with each other in the adjacent packages 1. Further, the cover substrates 12 may be also in contact with each other in the adjacent packages 1. Therefore, the arrangement density of the packages 1 can be higher than the case where the light emitting diodes are connected in series.

In addition, for the header 3, instead of using the support base 3a made of the metal material and the spacer 3b made of the insulating material, it is possible to provide the entire of the header 3 with an insulating material such as synthetic resin and ceramics etc.

As described above, in this embodiment, electrodes of the UV-ray light emitting diodes 2 as semiconductor device are configured by the base substrates 11 and the cover substrates 12. Therefore, the structure is simple as compared with the structure where terminals are separately provided, and the increase in the number of manufacturing process can be suppressed. Further, since the package 1 is provided with the metal plate, it is possible to maintain heat radiation performance even in a case where the package houses a power element such as high intensity UV-ray light emitting diode 2. As a result, it is possible to suppress deterioration in light intensity caused by temperature raise.

In addition, since the electrodes of the UV-ray light emitting diode 2 are provided with the base substrate 11 and the cover substrate 12, and since the base substrate 11 and the cover substrate 12 are formed into rectangular shapes and the cover substrate 12 is stacked on the base substrate 11 mounted on the header 33 in its thickness direction, the device can be formed into an elongated shape easily by arranging plural elements on the mount surface of the header 3. Consequently, it is possible to form a elongated light source of UV-ray or visible light with a desired shape. Moreover, since only a small interval is formed between the adjacent packages 1, it is possible to provide an elongated light source with small unevenness in light intensity along the longitudinal direction.

Furthermore, the package 1 is fixed to the header 3 with the mount screws 19 which pass through the base substrate 11 so that solder bonding is not required for connection of the electrodes. Therefore, fixture strength between the base substrate 11 and the header 3 can be high and assembly and disassembly of these parts for maintenance can be performed easily.

Second Embodiment

Figure 6:
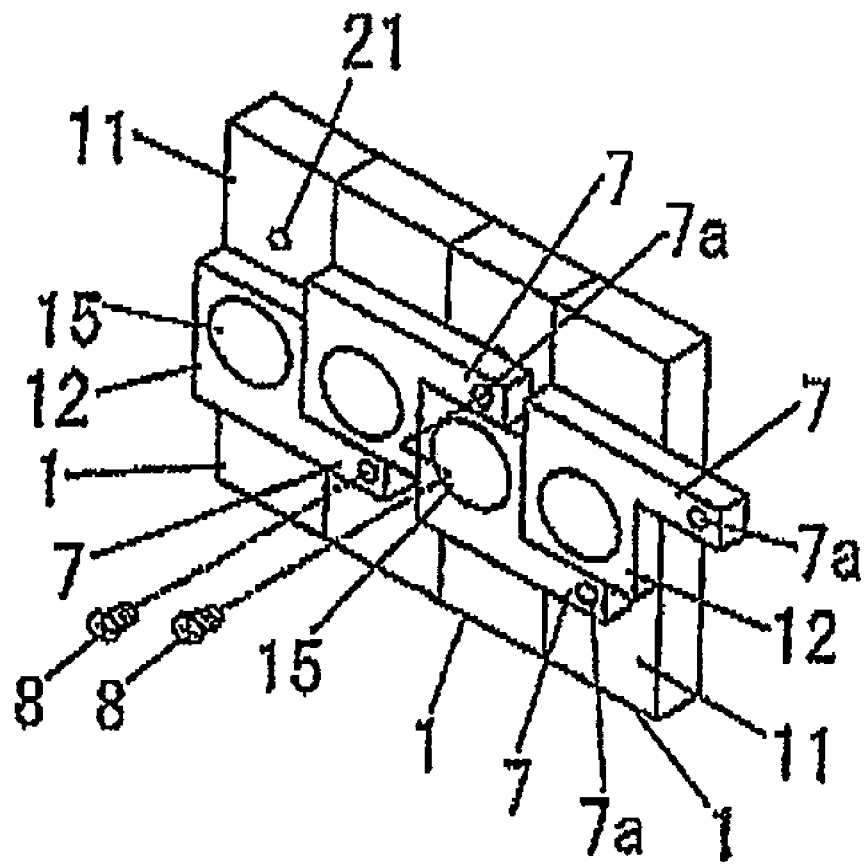
FIG. 6 is a perspective view showing an example use of a package of a second embodiment of the present invention.
Figure 7:
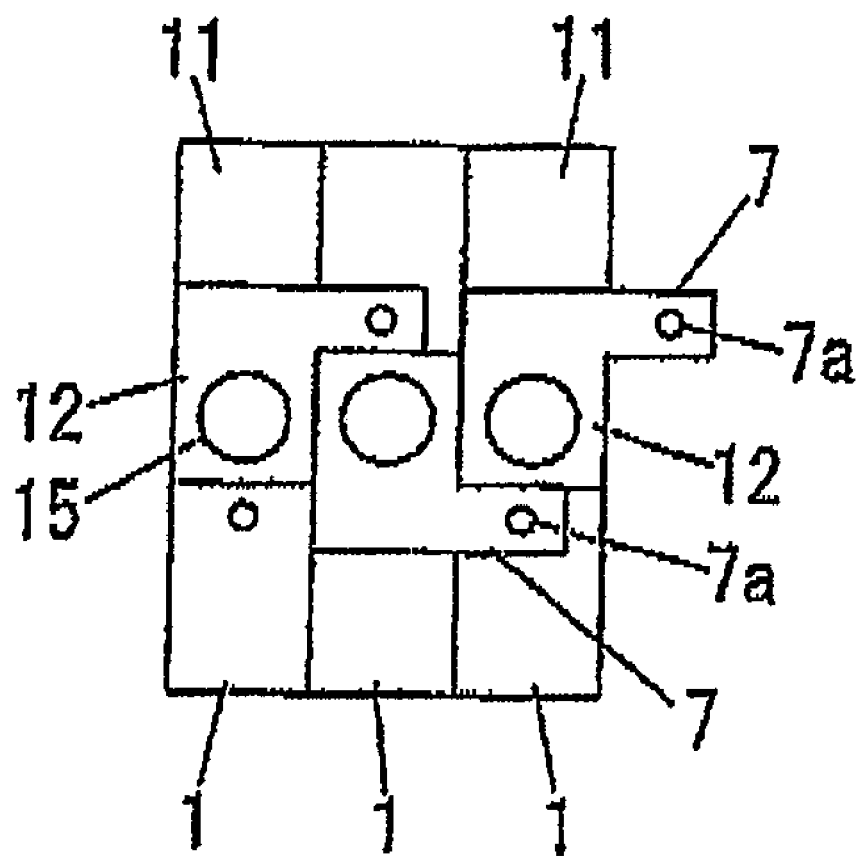
FIG. 7 is a front view showing the example use of the package.

The first embodiment has provided the example where the base substrates 1 and the cover substrates 12 are electrically connected to each other through the connection plates 5 that are elements separate from the packages 1. However, in the present embodiment, the cover substrates 12 and the base substrates 11 are connected together through, as the first connecting conductors, connection pieces 7 continuously, integrally extending from the respective cover substrates 12 in place of the connection plates 5 as shown in FIGS. 6 and 7. Specifically, the connection piece 7 extends, in the widthwise direction of the base substrate 11, from one side surface at one end of the cover substrate 12 distant from the center of the base substrate 11 in its longitudinal direction. In the present embodiment, the cover side connection hole 22 is not formed in the cover substrate 12, and a through hole 7a is formed in an extremity of the connection piece 7.

In order to connect the semiconductor devices in series, the plurality of packages 1 are arranged side by side in the widthwise direction of the base substrate 11. The connection piece 7 extending from the cover substrate 12 is superposed on the base substrate 11 of the adjacent package 1. Further, a connection screw 8 is screwed into the base side connection hole 21 of the base substrate 11 passing through the through hole 7a opened in the extremity of the connection piece 7. Specifically, the connection piece 7 provided on the cover substrate 12 of one of the adjacent packages 1 is electrically connected to the base substrate 11 of the other package 1, whereupon the two packages 1 are connected in series.

By repetition of the connection, the plurality of packages 1 can be connected in series. As in the first embodiment, the packages must be arranged such that the positions of the cover substrates 12 become staggered. However, even when the positions of the cover substrates 12 become different from each other, the connection pieces 7 must be caused to project in the same direction. Therefore, there are required two types of packages 1 that differ from each other in terms of the position of the connection piece 7 on the cover substrate 12.

The two types of packages 1 are arranged one after another along the widthwise direction of the base substrate 11, so that the adjacent packages 1 can be connected in series. Further, the connection piece 7 extended from the cover substrate 12 is superposed on the front surface of the base substrate 11. Hence, the connection piece 7 is separated from the base substrate 11 by an amount corresponding to the thickness of the insulating material layer 13. Since the thickness of the insulating material layer 13 is minute, no particular problems arise; however, stress arises in the connection pieces 17.

In order to prevent occurrence of stress in the connection pieces 7, the essential requirement is to interpose between the connection piece 7 and the base substrate 11 a spacer made from a conductive material whose thickness is equal to the thickness of the insulating material layer 13 or create a step in an intermediate area of the connection piece 7. In other respects, the second embodiment is identical in structure and operation with the first embodiment.

Third Embodiment

Figure 8A:
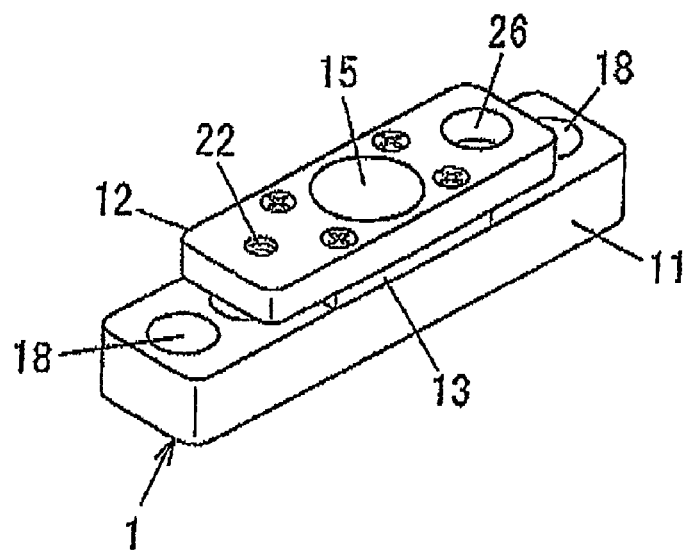
FIGS. 8A and 8B are perspective views of a third embodiment of the present invention.
Figure 8B:
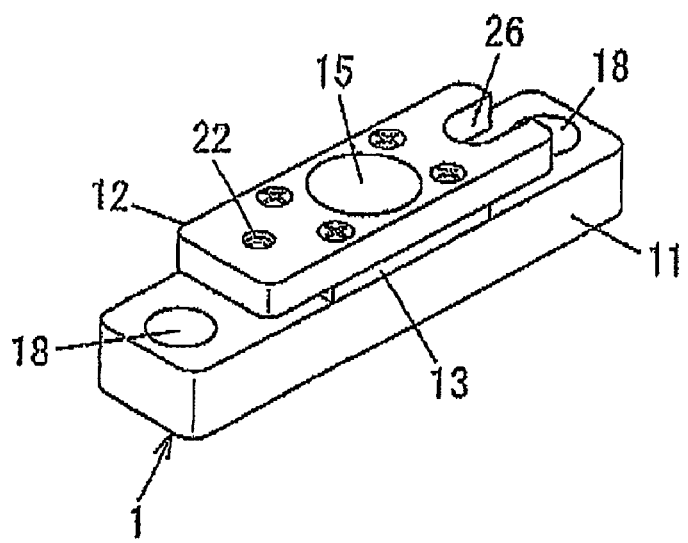

In the foregoing embodiments, the distances from the center line of the base substrate 11 along the widthwise direction thereof to the respective end edges of the cover substrate 12 in the longitudinal direction are different. In the present embodiment, as shown in FIGS. 8A and 8B, the center line of the base substrate 11 along the widthwise direction thereof and the center line of the cover substrate 12 along the widthwise direction thereof are aligned such that the distances from the center line of the base substrate 11 to the respective end edges of the cover substrate 12 in the longitudinal direction thereof are the same. On the other hand, in order to avoid the base side connection hole 21 being covered with the cover substrate 12 in such a structure, a bore 26 is formed on the cover substrate 12 to expose the base side connection hole 21.

The bore 26 can be formed with a through hole having a diameter larger than that of the head of the connection screw 6 such that the connection screw 6 does not contact with it as shown in FIG. 8A or can be formed with a notch having an opening width which is wider than the diameter of the head of the connection screw 6 such that the connection screw 6 does not contact with it as shown in FIG. 8B. Here, the through hole means a structure in which a circumferential wall entirely surrounds internal space of the bore, whereas the notch means a structure in which apart of the circumferential wall is opened. Incidentally, although the bore 26 as the notch shown in FIG. 8B is opened at the longitudinal end surface of the cover substrate 12, it is possible to employ a structure in which the bore 26 is opened to a side surface of the cover substrate 12 in the widthwise direction thereof.

Figure 9:
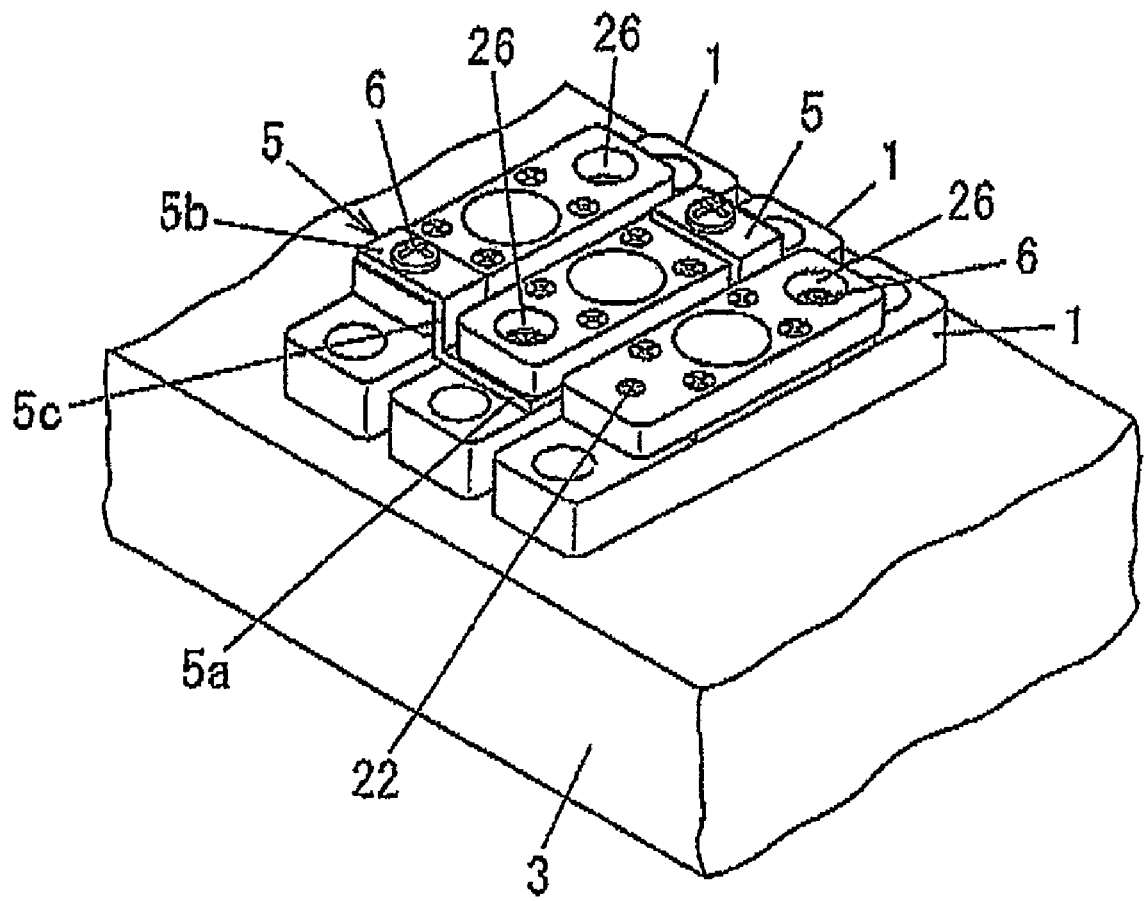
FIG. 9 is a perspective view showing the example use of the package of the third embodiment of the invention.

In the present embodiment, the structure in which the package 1 is mounted on the header 3 as the support base is similar to the first embodiment. In order to connect the UV-ray light emitting diodes 2 in series, as shown in FIG. 9, the base substrate 11 and the cover substrate 12 in the adjacent packages 1 are connected through the connection plate 5. In the arrangement shown in the first embodiment, the cover substrate 12 was not located at the position at which the base side piece 5a of the connection plate 5 is arranged in the adjacent packages 1. Therefore, it was not necessary to take into account of insulation between the base side piece 5a and the cover substrate 12 provided in the package 1 to which the base side piece 5a is connected. On the other hand, in the present embodiment, since the base side piece 5a and the cover substrate 12 are partially superposed, it is necessary to take into account of the insulation between them.

Accordingly, it is required to set the clearance between the base substrate 11 and the cover substrate 12 to be larger than the thickness of the base side piece 5 and to set the clearance between the cover substrates 12 in the adjacent packages 1 to be larger than the thickness of the joint piece 5c. The clearance between the base substrate 11 and the cover substrate 12 is secured by the thickness of the insulation material layer 13 (See FIGS. 3 and 4.). The clearance between the adjacent cover substrates 12 is secured by setting a larger distance between the packages 1 on the header 3, or by forming the width of the cover substrate 12 to be smaller than that of the base substrate 11.

By the structure as described above, similarly to the first embodiment, it is possible to electrically connect the base substrate 11 and the cover substrate 12 in the adjacent packages 1 through the connection plate 5. Further, by forming the bore 26, it is possible to prevent short circuit between the base substrate 11 and the cover substrate 12 within the same package 1 even if metal connection screw 6 is used. Therefore, similarly to the first embodiment, it is possible to connect the UV-ray light emitting diode 2 in series. In other respects, the third embodiment is identical in structure and operation with the first embodiment.

Fourth Embodiment

The present embodiment shows a structure in which the UV-ray light emitting diodes 2 are connected in parallel. Although the foregoing embodiments, the base side connection holes 21 are formed in the base substrate 11, the base side connection hole 21 is not formed in the present embodiment. Accordingly, it is possible to reduce the length of the base substrate 11 as compared with the foregoing embodiments. On the other hand, the cover side connection hole 22 (See FIG. 4) is still formed in the cover substrate 12.

Figure 10:
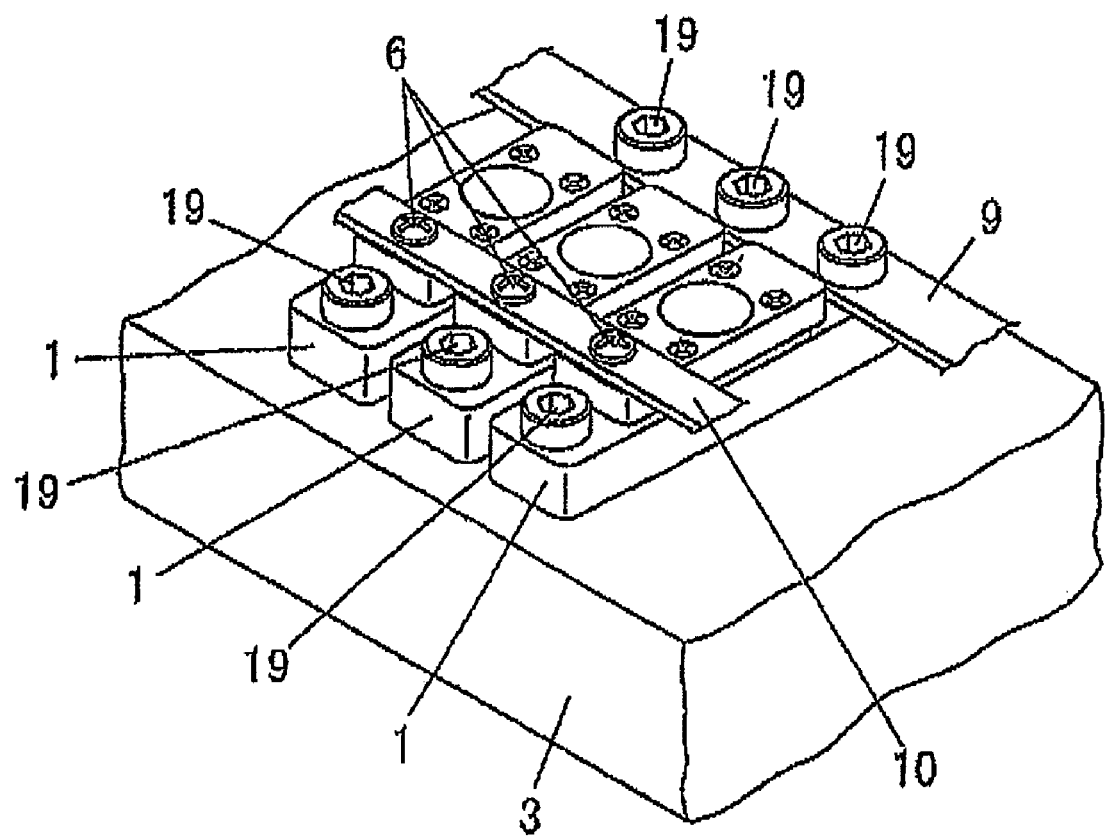
FIG. 10 is a perspective view showing an example use of a package of a fourth embodiment of the present invention.

As shown in FIG. 10, similarly to the first embodiment, to mount the packages 1 on the header 3 as the support base, the mount screws 19 pass through the mount holes 18 formed in opposite longitudinal ends of the base substrate 11 and the mount screws 19 are screwed into the header 3. To mount the packages 1 on the header 3, the packages 1 are arranged such that the cover side connection holes 22 are aligned along the longitudinal direction of the header 3.

In the present embodiment where the UV-ray light emitting diodes 2 are connected in parallel, in order to connect the base substrates 11 to each other in the packages 1 adjacently arranged, the following structure is employed. That is, a connection plate 9 as a second connecting conductor formed in a strip shape is stacked on front surfaces of the adjacent base substrates 11 such that mount screws 19 pass through the connection plate 9 and the base substrates 11. Thus, the connection plate 9 is fixed to the base substrates 11 at the same time of fixing the base substrates 11 to the header 3.

According to the above structure, the fixture of the base substrates 11 and the electric connection with the connection plate 9 are performed at the same time. Therefore, it is not necessary to form the base side connection holes 21 for connecting the connection plate 9 with the base substrates 11 as formed in the first embodiment. As a result, it is possible to downsize of the base substrate 11. Further, it is possible to reduce the number of parts as the connection screw 6 is unnecessary.

The cover substrates 12 in the packages 1 arranged adjacently are electrically connected with each other by stacking a connection plate 10 formed in a strip shape as a first connecting conductor on front surfaces of the cover substrates 12, and passing the connection screws 6 that is screwed into the cover side connection hole 22 through the connection plate 10.

By the structure as described above, since the base substrates 11 of the packages 1 mounted on the header 3 are connected with each other through the connection plates 9 and the cover substrates 12 are connected with each other through the connection plates 10, the UV-ray light emitting diodes 2 can be connected in parallel. Incidentally, in the present embodiment, as the UV-ray light emitting diodes 2 are connected in parallel, the base substrates 11 are allowed to be in contact with each other. Further, the cover substrates 12 are allowed to be in contact with each other.

Figure 11:
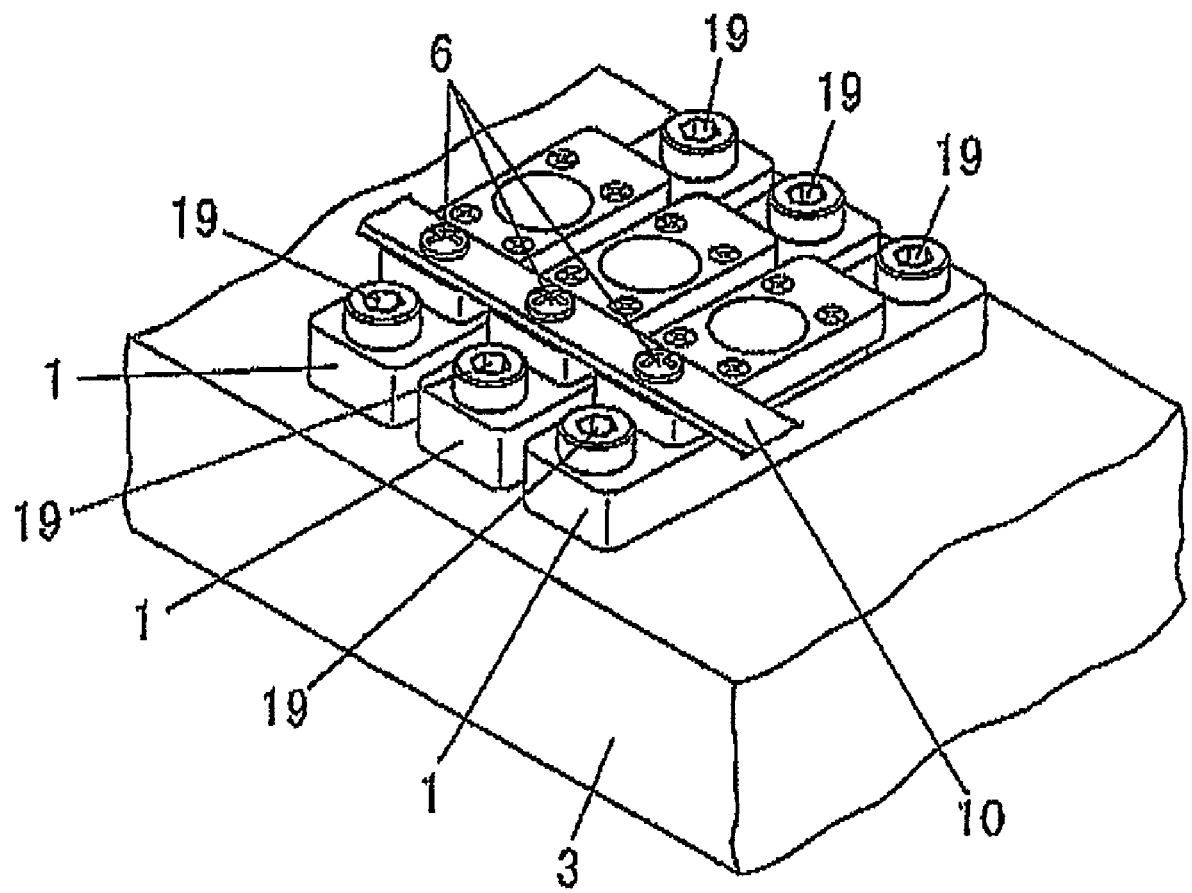
FIG. 11 is a perspective view showing the example use of the package of the fourth embodiment of the invention.

The structure shown in FIG. 10 is not limited for the case where the header 3 is provided with a metal material and it can be employed for the case where the header 3 is provided with an insulating material such as synthetic resin and ceramics etc. In a case where the header 3 is provided with a conductive metal material, the connection plate 9 for connecting the base substrates 11 with each other can be omitted. In other words, as shown in FIG. 11, by fixing the base substrates 11 onto the header 3 so as to directly contact therewith by the mount screws 19, the base substrates 11 in the packages 1 mounted on the header 3 are electrically connected with each other through the header 3. Therefore, the connection plate 9 is not necessary and the number of parts is reduced. In addition, since the base substrates 11 are brought into direct contact with the header 3, the heat radiation performance of the header 3 is improved.

The connection plates 9, 10 are formed merely with linear strips. Therefore, the shape is simplified and it is sufficient to provide only one sheet of connection plate 9 and only one sheet of connection plate 10 for one header 3. The number of parts is maintained small. In other respects, the fourth embodiment is identical in structure and operation with the first embodiment.

What is claimed is:

1. A package mounted in plural on a mount surface of a support base, housing a semiconductor element, comprising:
a base substrate which is made from a metal plate mounted on the support base and electrically connected to one electrode of the semiconductor element; and
a cover substrate which is made from a metal plate stacked on one surface of the base substrate in a thickness direction and electrically connected to another electrode of the semiconductor element,
wherein the base substrate has a mount hole through which a mount screw screwed to the support base passes, and the cover substrate has a cover side connection hole into which a first connection screw passing through a first connecting conductor is screwed.

2. The package according to claim 1, wherein the semiconductor element is a light emitting diode.

3. The package according to claim 1, wherein the base substrate has a base side connection hole into which a second connection screw passing through one end of a first connecting conductor electrically connected to a cover substrate stacked on a base substrate in an adjacent package is screwed; and
the cover substrate is disposed in an asymmetrical shape with respect to a center line of the base substrate extending in an arranging direction in which base substrates are to be arranged on the support base and disposed so as to traverse the center line, and
the base side connection hole is formed on one side with respect to the center line.

4. The package according to claim 3, wherein the cover substrate is configured so that distances from the center line to respective end edges of the cover substrate that are located opposite sides of the center line are different with each other, the base side connection hole is formed in an area where the cover substrate is not superposed on the base substrate.

5. The package according to claim 3, wherein a bore is notched in the cover substrate at a position superposing on the base side connection hole in a size such that the cover substrate does not contact with the second connection screw.

6. The package according to claim 3, wherein a cover side connection hole into which a first connection screw passing through a first connecting conductor is screwed is formed in the cover substrate at an opposite side of the base side connection hole with respect to the center line.

7. A semiconductor device including the packages of claim 3 which are mounted on the support base such that the center lines of the base substrates are aligned to each other, wherein adjacent packages are arranged such that positions of the cover substrates are staggered with respect to the center lines.

8. The semiconductor device according to claim 7, wherein the first connecting conductor is a connection plate mounted on the cover substrate and includes a base-side piece superposed on a front surface of the base substrate, a cover-side piece superposed on a front surface of the cover substrate, and a joint piece for joining the base-side piece to the cover-side piece.

9. The semiconductor device according to claim 7, wherein the first connecting conductor is a connection piece formed continuously, integrally on the cover substrate, and an extremity of the connection piece is superposed on the front surface of the base substrate.

10. A semiconductor device comprising a plurality of packages according to claim 1 which are mounted on the support base, wherein the support base is formed with a conductive metal material, and
the base substrates of the plurality of packages are electrically connected with the support base.

11. A semiconductor device comprising a plurality of packages according to claim 1 which are mounted on the support base, wherein the support base is formed with an insulating material.

12. A semiconductor device comprising a plurality of packages of claim 1 which are mounted on the support base, wherein the packages are mounted on the support base such that center lines of the base substrates extending along an arranging direction of the base substrates on the support base are aligned to each other and that the cover side connection holes are aligned to each other, and
the first connecting conductor is disposed so as to traverse plural packages and is fixed to the cover substrates by first connection screws.

13. The semiconductor device according to claim 12, wherein a second connecting conductor superposing on the base substrates is disposed so as to traverse plural packages, and the second connecting conductor is fixed to the support base along with the packages by passing the mount screws through the second connecting conductor.

14. The package according to claim 1, wherein an insulating material layer is interposed between the base substrate and the cover substrate.

15. The package according to claim 1, further comprising a connection plate for electrically connecting the base substrate to another cover substrate stacked on an adjacent base substrate, the connection plate includes a base-side piece that overlaps with a front surface of the base substrate, a cover-side piece that overlaps with a front surface of said another cover substrate and a joint piece that links the base-side piece to the cover-side piece.

* * * * *